United States Patent
Yao et al.

(10) Patent No.: US 7,074,629 B2
(45) Date of Patent: Jul. 11, 2006

(54) TEST PATTERNS FOR MEASUREMENT OF EFFECTIVE VACANCY DIFFUSION AREA

(75) Inventors: Chih-Hsiang Yao, Hsin-Chu (TW); Tai-Chun Huang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 9 days.

(21) Appl. No.: 11/018,604

(22) Filed: Dec. 21, 2004

(65) Prior Publication Data

US 2005/0139827 A1 Jun. 30, 2005

Related U.S. Application Data

(62) Division of application No. 10/602,147, filed on Jun. 24, 2003, now Pat. No. 6,864,701.

(51) Int. Cl.
*G01R 31/26* (2006.01)

(52) U.S. Cl. ............................ 438/14; 438/11; 438/18; 257/48; 324/765

(58) Field of Classification Search ................ 257/48; 438/11, 14, 18; 324/765
See application file for complete search history.

(56) References Cited

U.S. PATENT DOCUMENTS 6,194,739 B1    2/2001 Ivanov et al.
6,577,149 B1    6/2003 Doong et al.

OTHER PUBLICATIONS

Ogawa, E.T., et al, "Stress-Induced Voiding under Vias Connected to Wide Cu Metal Leads," IEEE International Reliability Physics Symposium Proceedings, 40th Annual, 2002, pp. 312-321.

*Primary Examiner*—Minhloan Tran
*Assistant Examiner*—Tan Tran
(74) *Attorney, Agent, or Firm*—Slater & Matsil, L.L.P.

(57) ABSTRACT

A test pattern (100, 200, 300, 400, 600, 700) has a first metal structure (102) disposed on a substrate (352), one or more intermediate layers (358) disposed above the first metal structure (102) and a second metal structure (104) disposed above the one or more intermediate layers (352). A first via (106) passes through the intermediate layers (352) and connects the first metal structure (102) to the second metal structure (104). One or more third metal structures (108) are disposed above the one or more intermediate layers (352) and the first metal structure (102). One or more second vias (110) pass through the intermediate layers (352) and connect the first metal structure (102) to the third metal structures (108). The second vias (110) are located outside of a radius (R) from a center of the first via (106). The third metal structures (110) are separated from the second metal structure (104) by a dielectric material (366).

20 Claims, 6 Drawing Sheets

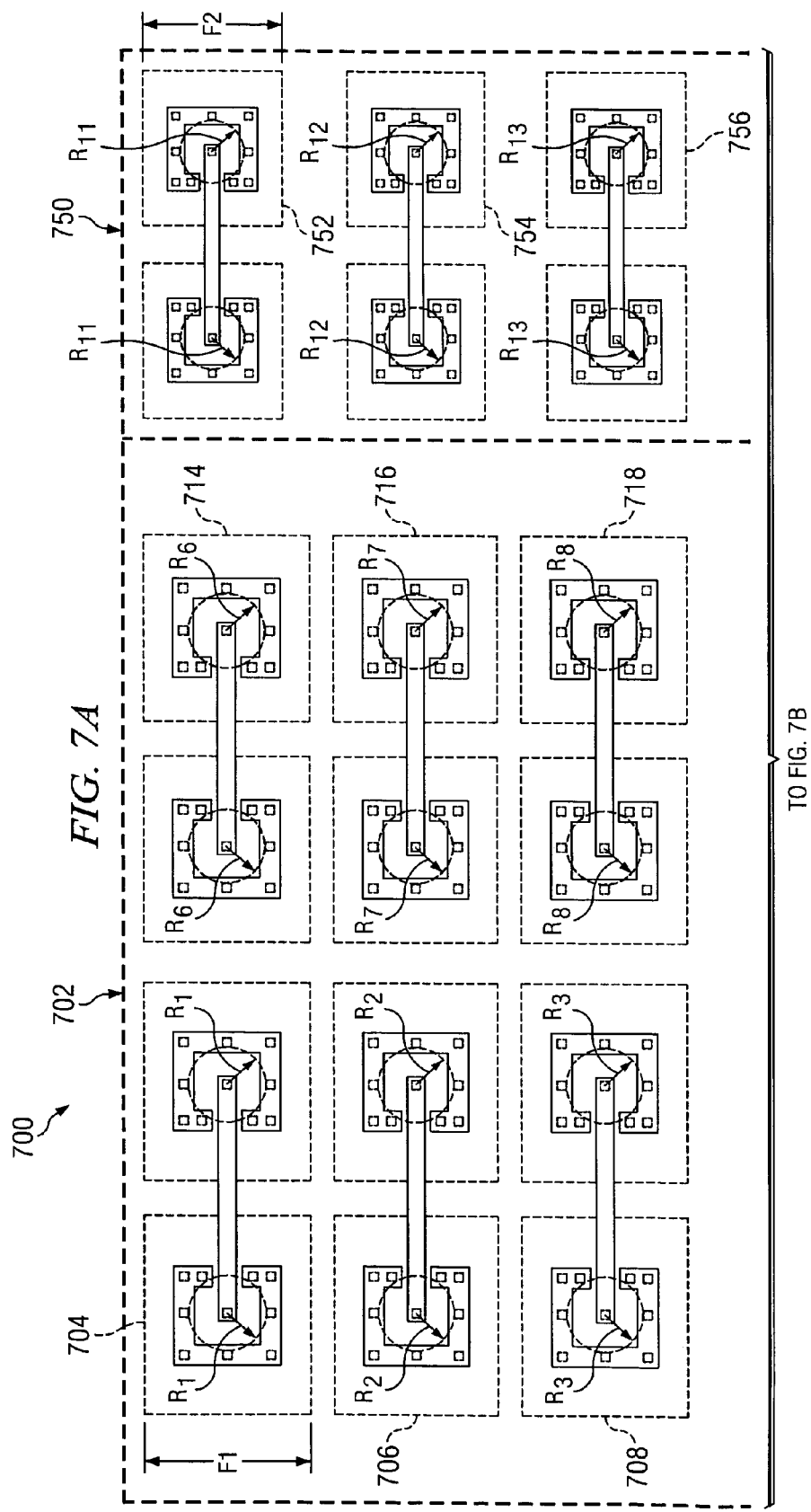

TEST PATTERNS FOR MEASUREMENT OF EFFECTIVE VACANCY DIFFUSION AREA

This application is a divisional application of Ser. No. 10/602,147 filed on Jun. 24, 2003 now U.S. Pat. No. 6,864,701, entitled "Test Patterns for Measurement of Effective Vacancy Diffusion Area," which application is hereby incorporated herein by reference.

TECHNICAL FIELD

The present invention relates in general to the field of fabricating semiconductor devices, and more particularly to a test pattern for measurement of effective vacancy diffusion area.

BACKGROUND

Stress-induced via bottom voiding is a fatal reliability issue commonly encountered in typical copper low-k dielectric interconnect structures. The formation of voids at the bottom of the vias results from the stress gradient distributions in the copper/low-k dielectric interconnect structures, vacancies in the grain boundary of the electroplated copper, and the capability of the vacancies to diffuse through the material.

In general, the stress gradient drives the vacancies toward the via bottom through the pathways of copper grain boundary and the interfaces of copper and the underlying etch stop layer. For a given reliability and thermal stress/test condition, such as 175° C. and 500 hours, there is a characteristic property, namely the effective vacancy diffusion area, that can characterize the effective copper area within which vacancies will be driven to the via bottom and form potentially fatal voids.

Therefore, the effective vacancy diffusion area is unique for a given silicon processing baseline and can be used to derive many design rules for a given technology node. Currently, a clear index of the metallization quality of a certain baseline process cannot be obtained. As a result, there is a need for a test pattern that can be used to derive the effective vacancy diffusion area for a given baseline process and technology node.

SUMMARY OF THE INVENTION

The preferred embodiment of the present invention provides test patterns and methods that can be used to measure the effective vacancy diffusion area of a given baseline metallization process. In one aspect, the invention provides for a test pattern having a first metal structure disposed on a substrate, one or more intermediate layers disposed above the first metal structure, and a second metal structure disposed above the one or more intermediate layers. At least a portion of the second metal structure is disposed above the first metal structure. In addition, the second metal structure is smaller than the first metal structure. The test pattern also includes a first via passing through the intermediate layers and connecting the first metal structure to the second metal structure, one or more third metal structures disposed above the one or more intermediate layers and the first metal structure, and one or more second vias passing through the intermediate layers and connecting the first metal structure to the third metal structures. The second vias are located outside of a radius from a center of the first via. The third metal structures are separated from the second metal structure by a dielectric material.

The test pattern may also include a fourth metal structure disposed on the substrate in close proximity to the first metal structure, wherein the one or more intermediate layers are disposed above the fourth metal structure and another portion of the second metal structure is disposed above the fourth metal structure. A third via passes through the intermediate layers and connects the fourth metal structure to the second metal structure. In addition, one or more fifth metal structures are disposed above the one or more intermediate layers and the fourth metal structure. The third vias are located outside of the radius from a center of the third via. The fifth metal structures are separated from the second metal structure by the dielectric material. One or more fourth vias also pass through the intermediate layers and connect the fourth metal structure to the fifth metal structures.

In another aspect, the invention provides for a test pattern that includes two or more test substructures. Each test substructure includes a first metal structure disposed on a substrate, one or more intermediate layers disposed above the first metal structure, and a second metal structure disposed above the one or more intermediate layers. At least a portion of the second metal structure is disposed above the first metal structure. In addition, the second metal structure is smaller than the first metal structure. The test pattern also includes a first via passing through the intermediate layers and connecting the first metal structure to the second metal structure, one or more third metal structures disposed above the one or more intermediate layers and the first metal structure, and one or more second vias passing through the intermediate layers and connecting the first metal structure to the third metal structures. The second vias are located outside of a radius from a center of the first via, which is different for each test substructure. The third metal structures are separated from the second metal structure by a dielectric material. Each test substructure may also include a fourth metal structure disposed on the substrate in close proximity to the first metal structure, wherein the one or more intermediate layers are disposed above the fourth metal structure and another portion of the second metal structure is disposed above the fourth metal structure. A third via passes through the intermediate layers and connects the fourth metal structure to the second metal structure. In addition, one or more fifth metal structures are disposed above the one or more intermediate layers and the fourth metal structure. The fifth metal structures are separated from the second metal structure by the dielectric material. One or more fourth vias also pass through the intermediate layers and connect the fourth metal structure to the fifth metal structures. The fourth vias are located outside of the radius from a center of the third via.

The test pattern may also include two or more test structures wherein each test structure includes the two or more test substructures wherein the size of the first metal structure is substantially constant for each test substructure and different for each test structure.

In addition, the present invention provides a method for determining an effective vacancy diffusion area for a silicon-on-insulator structure by forming two or more test substructures on the substrate, measuring a resistance between a second metal structure and a third metal structure(s) of each test substructure before and after thermal stressing of the silicon-on-insulator structure, and determining the effective vacancy diffusion area based on a change in the resistance measurements. Each test substructure includes a first metal structure disposed on a substrate, one or more intermediate layers disposed above the first metal structure and the second metal structure disposed above the one or more intermediate layers. At least a portion of the second metal structure is disposed above the first metal structure. In addition, the second metal structure is smaller than the first metal structure. The test substructure also includes a first via passing through the intermediate layers and connecting the first metal structure to the second metal structure. The third metal structure(s) are disposed above the one or more intermediate layers and the first metal structure. One or more second vias pass through the intermediate layers and connect the first metal structure to the third metal structures. The second vias are located outside of a radius from a center of the first via, which is different for each test substructure. The third metal structures ate separated from the second metal structure by a dielectric material.

BRIEF DESCRIPTION OF THE DRAWINGS

For a more complete understanding of the present invention, and the advantages thereof, reference is now made to the following descriptions taken in conjunction with the accompanying drawing, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The preferred embodiments of the present invention provide a test pattern and method that can be used to measure the effective vacancy diffusion area of a certain baseline metallization process. In general, the test pattern includes a hump structure. For example, the test pattern can include a first metal structure underlying a second metal structure and electrically coupled thereto by a via. The area of the first metal structure is preferably larger than that of the second metal structure and the first via is connected at or near the center of the first metal structure.

The sensitivity of the test pattern can be increased by increasing the area or volume of the first metal structure since any vacancies embedded in the grain boundary of the metal are proportional to the underlying metal volume/area. As a result, the size ratio of the first metal structure to the second metal structure will be determined by the process being used and the desired sensitivity of the test pattern.

One or more second vias, also referred to as dummy vias, can be positioned on a circle approximately centered on the first via and having a radius of R. Increasing the number of second vias will make the test pattern more sensitive to the resistance variation. The dummy vias are connected to a third metal structure, also referred to as a dummy metal island. The radius R is varied for different test structures within the test pattern. $R_o$ is considered to be the effective vacancy diffusion area of the baseline metallization process. Test patterns having a radius R smaller than or equal to Ro show no failure in terms of their electrical properties.

Once the effective diffusion area is measured, copper/low-k interconnects can be designed to avoid the stress-induced voiding and enhance the product reliability. In addition, the strength of the baseline metallization processes can be monitored and indexed with the comparison of their effective vacancy diffusion area; the smaller the effective vacancy diffusion area, the better the baseline or a recipe.

Figure 1:
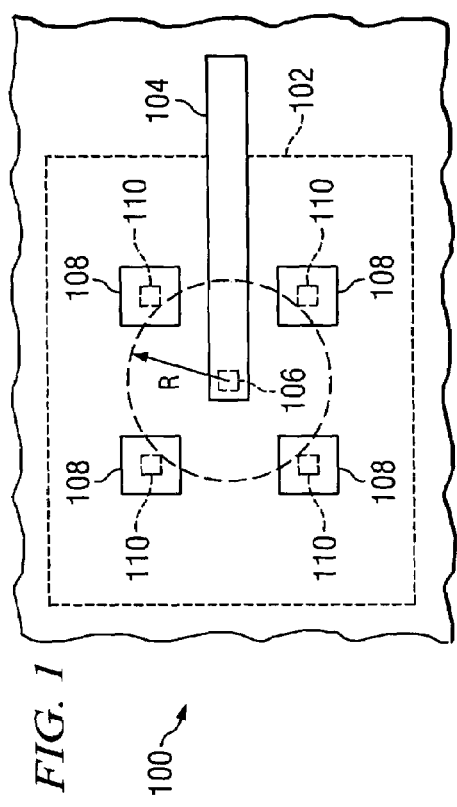
FIG. 1 is a diagram of a test structure/substructure in accordance with one embodiment of the present invention.
Figure 3A:
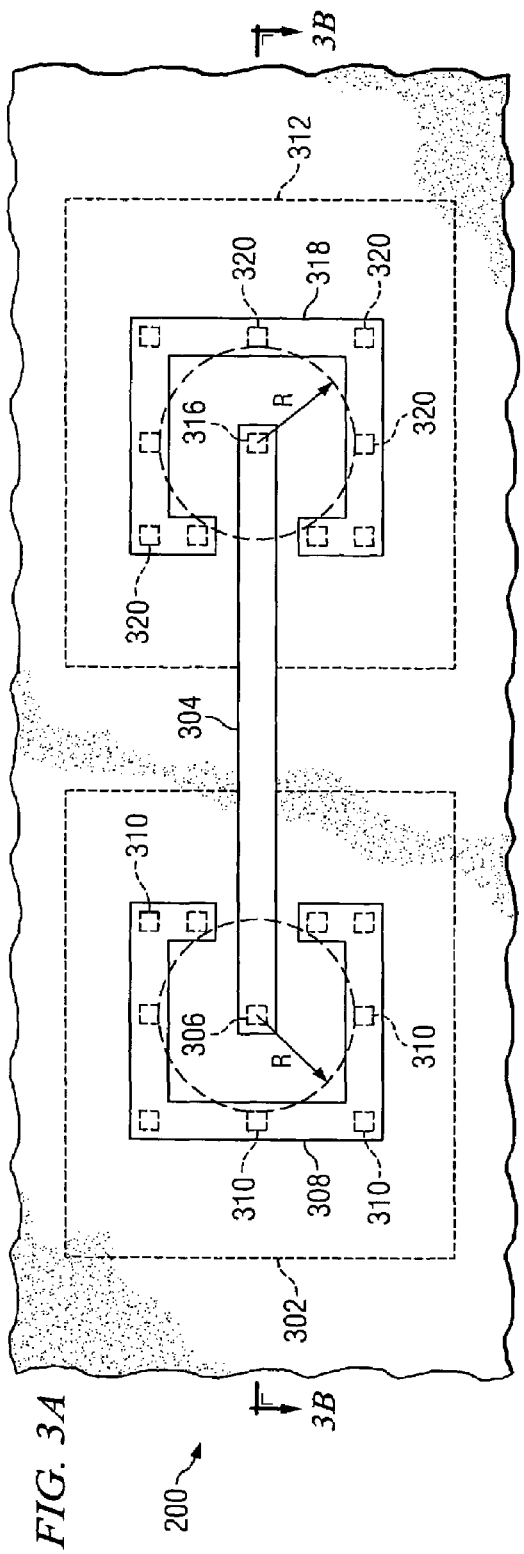
FIG. 3A is a diagram of a test structure/substructure in accordance with another embodiment of the present invention.
Figure 3B:
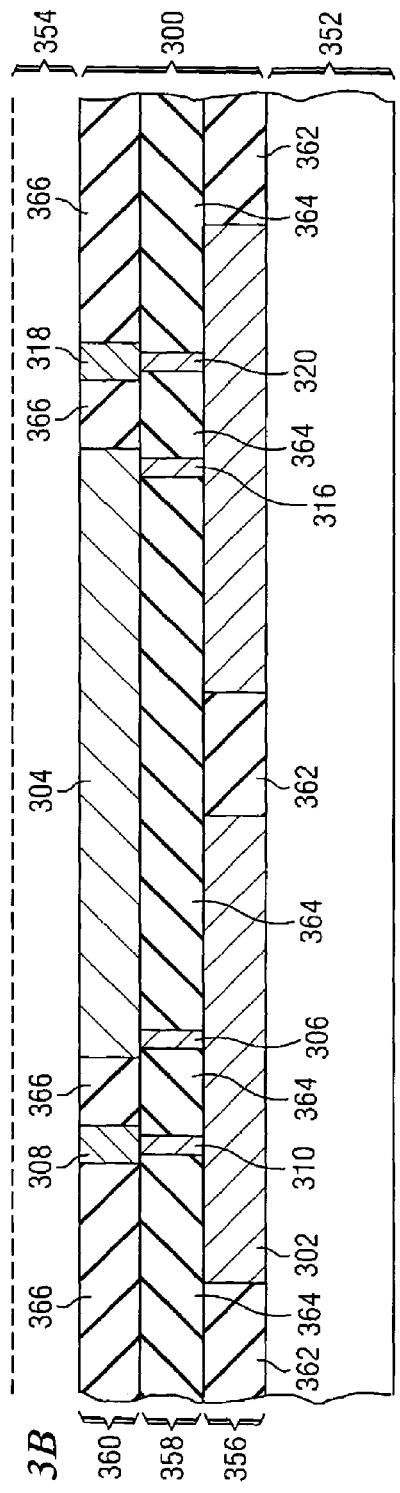
FIG. 3B is a cross-sectional view of the test structure/substructure of FIG. 3A in accordance with one embodiment of the present invention.

Now referring to FIG. 1, a diagram of a test structure 100 in accordance with one embodiment of the present invention is shown. This embodiment of the present invention provides a test pattern having a first metal structure 102 disposed over a substrate. One or more intermediate layers are disposed above the first metal structure 102. Intermediate layers are typically a dielectric such as silicon dioxide or silicon nitride. A similar cross-section is shown in FIG. 3B.

A second metal structure 104 is disposed above the one or more intermediate layers. At least a portion of the second metal structure 104 is disposed above the first metal structure 102. In addition, the second metal structure 104 is smaller than the first metal structure 102.

The test pattern also includes a first via 106 passing through the intermediate layers and connecting the first metal structure 102 to the second metal structure 104. The first via 106 is approximately centered over the first metal structure 102. One or more third metal structures 108 are disposed above the one or more intermediate layers and the first metal structure 102. The third metal structures are separated from the first metal structure 102 and the second metal structure 104 by dielectric material.

In addition, one or more second vias 110 pass through the intermediate layers and electrically connect the first metal structure 102 to the third metal structures 108, respectively. As shown in FIG. 1, each second via 110 is connected to a separate third metal structure 108. In an alternate embodiment, all of the second vias 110 are connected to a single third metal structure 108. Moreover, the present invention is not limited to the four second vias 110 shown because the actual number of second vias 110 will be determined in part on the desired sensitivity of the test structure/substructure 100.

The second vias 110 are located outside of a radius R from a center of the first via 106. The radius R is selected to measure the effective vacancy diffusion area, typically within a range of about 0.5 and about 10 µm. Preferably, first metal structure 102 is a copper structure formed within a first dielectric layer using a damascene or dual damascene process, and second metal structure 104 and third metal structures 108 are copper structures formed in the intervening dielectric layer also using a damascene or dual damascene process. In the case of the dual damascene process, vias 106 and 110 are formed simultaneously with the formation of metal structures 108 and 104.

In the preferred embodiments, the test pattern is disposed on a silicon-on-insulator structure wherein the intermediate layers substantially comprise a dielectric material. The dielectric material is typically a low-k dielectric material, which may be chosen from the group consisting of polymide, silicon oxycarbide, hydrogen silsesquioxane, methyl silsesquioxane, bezocyclobutene, fluorinated glass, fluorinated aromatic ether, inter-penetrated SOG, SILK™, Nanoglass™, Coral™ and Black Diamond™.

Each metal structure 102, 104 and 108 is typically a metal structure formed using a damascene or dual damascene process. The first metal structure 102, second metal structure 104, third metal structure 108, first via 106 and second vias 110 are typically copper. The first metal structure 102 typically has an area selected from a range of about 100 to about 500 $\mu m^2$, e.g., planar dimensions of 20 $\mu m$ by a multiple of 3 $\mu m$. In addition, the second metal structure 104 and the one or more third metal structures 108 are typically separated by a multiple of 0.5 $\mu m$.

Figure 2:
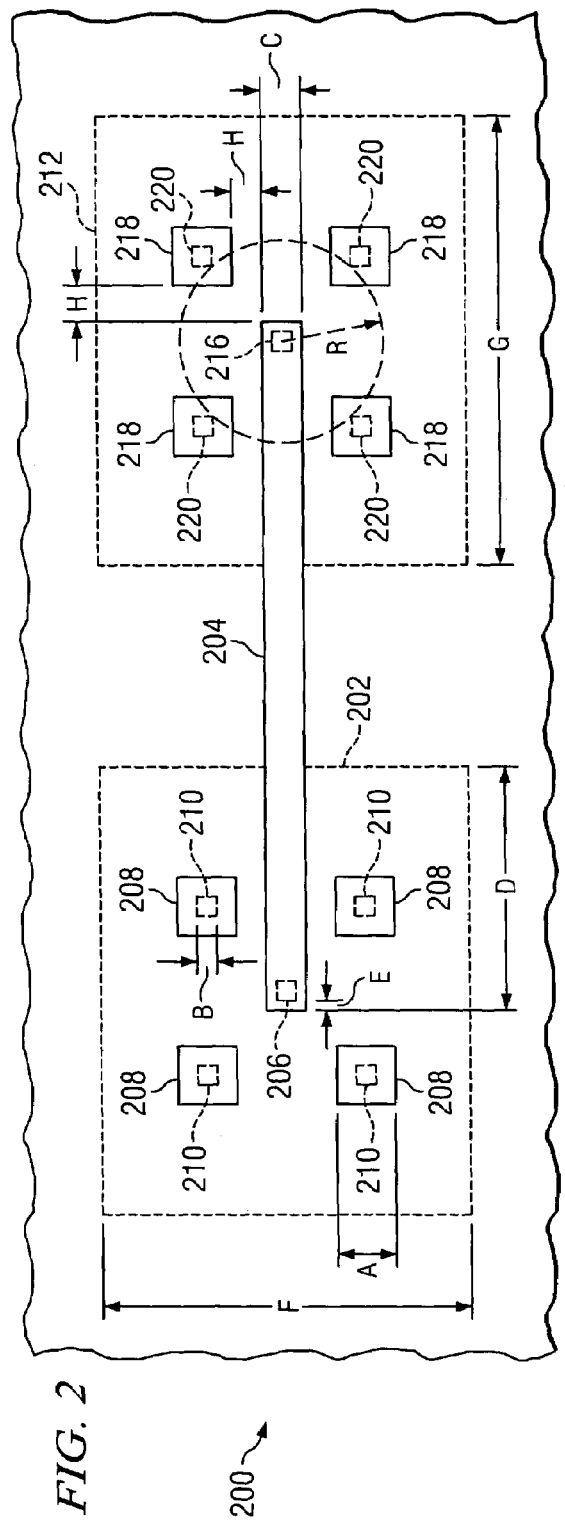
FIG. 2 is a diagram of a test structure/substructure in accordance with another embodiment of the present invention.

Referring now to FIG. 2, a diagram of a test structure/substructure 200 in accordance with another embodiment of the present invention is shown. The preferred embodiment provides a test pattern having a first metal structure 202 disposed on a substrate, one or more intermediate layers disposed above the first metal structure 202 and a second metal structure 204 disposed above the one or more intermediate layers. At least a portion of the second metal structure 204 is disposed above the first metal structure 202. Once again, the second metal structure 204 is preferably smaller than the first metal structure 202.

As in the first embodiment, the test pattern also includes a first via 206 passing through the intermediate layers and connecting the first metal structure 202 to the second metal structure 204. The first via 206 is approximately centered over the first metal structure 202. One or more third metal structures 208 are disposed above the one or more intermediate layers and the first metal structure 202 and are respectively electrically connected thereto by one or more second vias 210.

As shown in FIG. 2, each second via 210 is connected to a separate third metal structure 208. But, all of the second vias 210 can be connected to a single third metal structure 208. FIG. 3A illustrates such an embodiment. The second vias 210 are located outside of a radius R from a center of the first via 206. The radius R is selected to measure the effective vacancy diffusion area, typically within a range of 0.5 and 10 $\mu m$.

The test pattern also includes a fourth metal structure 212 disposed over the substrate in close proximity to the first metal structure 202. The one or more intermediate layers are disposed above the fourth metal structure 212 and another portion of the second metal structure 204 is disposed above the fourth metal structure 212. A third via 216 passes through the intermediate layers and connects the fourth metal structure 212 to the second metal structure 204. The third via 216 is approximately centered over the fourth metal structure 212.

In addition, one or more fifth metal structures 218 are disposed above the one or more intermediate layers and the fourth metal structure 212. The fifth metal structures 218 are separated from the second metal structure 204 by the dielectric material. One or more fourth vias 220 also pass through the intermediate layers and connect the fourth metal structure 212 to the fifth metal structures 218. The fourth vias 220 are located outside of the radius R from a center of the third via 216. As shown, each fourth via 220 is connected to a separate fifth metal structure 218. But, all of the fourth vias 220 can be connected to a single fifth metal structure 218. FIG. 3A illustrates such an embodiment. Preferably, the radius R of the second test structure 212 is different than the radius R of the first test structure 202.

The test pattern is disposed on more than one layer of a silicon-on-insulator structure wherein the intermediate layers substantially comprise a dielectric material. The dielectric material is typically a low-k dielectric material, which may be chosen from the group consisting of polymide, silicon oxycarbide, hydrogen silsesquioxane, methyl silsesquioxane, bezocyclobutene, fluorinated glass, fluorinated aromatic ether, inter-penetrated SOG, SILK™, Nanoglass™, Coral™ and Black Diamond™. Each metal structure 202, 204, 208, 212 and 218 is typically a metal structure formed using a damascene or dual damascene process. The first metal structure 202, second metal structure 204, third metal structure 208, fourth metal structure 212, fifth metal structure 218, first via 206, second vias 210, and third vias 220 are typically copper. The first metal structure 102 and fourth metal structure 212 typically have an area selected from a range of 100 to 500 $\mu m^2$, e.g., planar dimensions of 20 $\mu m$ by a multiple of 3 $\mu m$. In addition, the separation between the second metal structure 204 and the third and fifth metal structures 208 and 218 is typically a multiple of 0.5 $\mu m$.

In one embodiment of the present invention, the planar dimensions of the first metal structure are 20 $\mu m$ by a multiple of 3 $\mu m$, the second metal structures are at least 0.11 $\mu m$ by 10 $\mu m$, and the third metal structures are at least 0.3 $\mu m$ by 0.3 $\mu m$. In addition, the second metal structure and the one or more third metal structures are separated by a multiple of 0.5 $\mu m$, and the first via and second vias have a width of at least 0.1 $\mu m$. The following table provides some representative values for the dimensions illustrated in FIG. 2.

| Dimensions ($\mu m$) | | | | | | | |
|---|---|---|---|---|---|---|---|
| A | B | C | D | E | F | G | H |
| 0.3 | 0.1 | 0.11 | 10 | 0.005 | 6 to 12 | 20 | 0.5 to 5.0 |

Now referring to FIG. 3A, a diagram of a test structure/substructure 300 in accordance with another embodiment of the present invention is shown. The present invention provides a test pattern having a first metal structure 302 disposed on a substrate, one or more intermediate layers disposed above the first metal structure 302 and a second metal structure 304 disposed above the one or more intermediate layers. At least a portion of the second metal structure 304 is disposed above the first metal structure. In addition, the second metal structure 304 is smaller than the first metal structure 302. The test pattern also includes a first via 306 passing through the intermediate layers and connecting the first metal structure 302 to the second metal structure 304. The first via 306 is approximately centered over the first metal structure 302.

One or more third metal structures 308 are disposed above the one or more intermediate layers and the first metal structure 302. The third metal structures 308 are separated from the second metal structure 304 by a dielectric material. In addition, one or more second vias 310 pass through the intermediate layers and connect the first metal structure 302 to the third metal structures 308. As shown, all of the second vias 310 are connected to a single third metal structure 308.

The second vias 310 are located outside of a radius R from a center of the first via 306. The radius R is selected to measure the effective vacancy diffusion area, typically within a range of 0.5 and 10 μm.

The test pattern also includes a fourth metal structure 312 disposed on the substrate in close proximity to the first metal structure 302, wherein the one or more intermediate layers are disposed above the fourth metal structure 312 and another portion of the second metal structure 304 is disposed above the fourth metal structure 312. A third via 316 passes through the intermediate layers and connects the fourth metal structure 312 to the second metal structure 304. The third via 316 is approximately centered over the fourth metal structure 312. In addition, one or more fifth metal structures 318 are disposed above the one or more intermediate layers and the fourth metal structure 312. The fifth metal structures 318 are separated from the second metal structure 304 by the dielectric material. One or more fourth vias 320 also pass through the intermediate layers and connect the fourth metal structure 312 to the fifth metal structures 318. As shown, all of the fourth vias 320 are connected to a single fifth metal structure 318. The fourth vias 320 are located outside of the radius R from a center of the third via 316.

The test pattern is disposed on more than one layer of a silicon-on-insulator structure wherein the intermediate layers substantially comprise a dielectric material. The dielectric material is typically a low-k dielectric material, which may be chosen from the group consisting of polymide, silicon oxycarbide, hydrogen silsesquioxane, methyl silsesquioxane, bezocyclobutene, fluorinated glass, fluorinated aromatic ether, inter-penetrated SOG, SILK™, Nanoglass™, Coral™ and Black Diamond™. Each metal structure 302, 304, 308, 312 and 318 is typically a metal structure formed using a damascene or dual damascene process. The first metal structure 302, second metal structure 304, third metal structure 308, fourth metal structure 312, fifth metal structure 318, first via 306, second vias 310, and third vias 320 are typically copper. The first metal structure 302 and fourth metal structure 312 typically have an area selected from a range of 100 to 500 μm$^2$, e.g., planar dimensions of 20 μm by a multiple of 31 μm. In addition, the separation between the second metal structure 304 and the third and fifth metal structures 308 and 318 is typically a multiple of 0.5 μm.

Referring now to FIG. 3B, a cross-sectional view of the test structure/substructure 300 of FIG. 3A in accordance with one embodiment of the present invention is shown. The lower layer 352 can be the semiconductor substrate, silicon-on-insulator structure or any processing layer (e.g., an intermetal dielectric) preceding the test structure/substructure layers 354. The test structure/substructure layer includes a first structure layer 356, one or more intermediate layers 358 and a second structure layer 360. The first structure layer 356 includes the first metal structure 302 and second metal structure 312 separated by a dielectric material 362.

The intermediate layers 358 include the first via 306, second vias 310, third via 316 and fourth vias 320 separated by dielectric material 364. The second structure layer 360 includes the second metal structure 304, third metal structure 308 and fifth metal structure 318 separated by dielectric material 366. Dielectric material 362, 364 and 366 is typically a low-k dielectric material, which can be the same material or different depending on the situation. The dielectric material may be chosen from the group consisting of polymide, silicon oxycarbide, hydrogen silsesquioxane, methyl silsesquioxane, bezocyclobutene, fluorinated glass, fluorinated aromatic ether, inter-penetrated SOG, SILK™, Nanoglass™, Coral™ and Black Diamond™. Each metal structure 302, 304, 308, 312 and 318 is typically a metal structure, such as copper, formed using a damascene or dual damascene process. The test structure/substructure 300 can be created using standard processing techniques, such as a standard trench first dual damascene IC fabrication process. The metal structures 302, 304, 308, 312 and 318 can be damascene structures, multi-layer damascene structures, modified damascene structures, or other structures. The vias 306, 310, 316 and 320 are typically copper and can be created using standard processing techniques.

Figure 4:
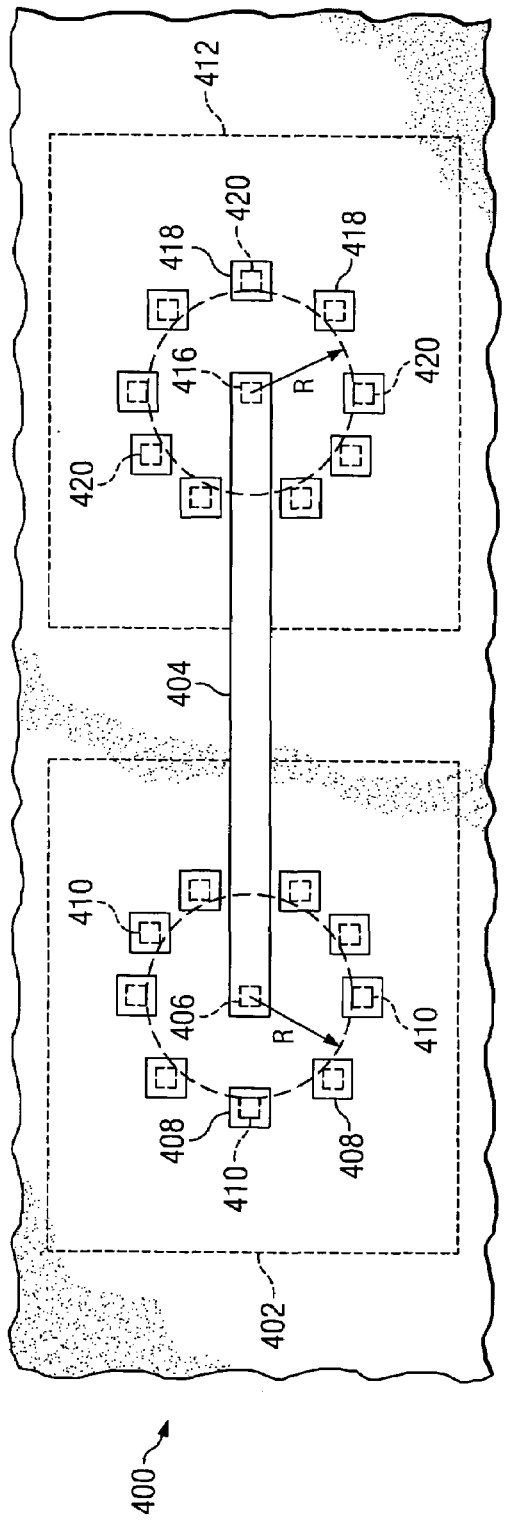
FIG. 4 is a diagram of a test structure/substructure in accordance with another embodiment of the present invention.

Now referring to FIG. 4, a diagram of a test structure/substructure 400 in accordance with another embodiment of the present invention is shown. The test pattern includes a first metal structure 402 disposed on a substrate, one or more intermediate layers disposed above the first metal structure 402, and a second metal structure 404 disposed above the one or more intermediate layers. At least a portion of the second metal structure 404 is disposed above the first metal structure 402. In addition, the second metal structure 404 is smaller than the first metal structure 402. The test pattern also includes a first via 406 passing through the intermediate layers and connecting the first metal structure 402 to the second metal structure 404. The first via 406 is approximately centered over the first metal structure 402. One or more third metal structures 408 are disposed above the one or more intermediate layers and the first metal structure 402. The third metal structures 408 are separated from the second metal structure 404 by a dielectric material. In addition, one or more second vias 410 pass through the intermediate layers and connect the first metal structure 402 to the third metal structures 408. As shown, each second via 410 is connected to a separate third metal structure 408. The second vias 410 are located outside of a radius R from a center of the first via 406. The radius R is selected to measure the effective vacancy diffusion area, typically within a range of 0.5 and 10 μm.

The test pattern also includes a fourth metal structure 412 disposed on the substrate in close proximity to the first metal structure 402, wherein the one or more intermediate layers are disposed above the fourth metal structure 412, and another portion of the second metal structure 404 is disposed above the fourth metal structure 412. A third via 416 passes through the intermediate layers and connects the fourth metal structure 412 to the second metal structure 404. The third via 416 is approximately centered over the fourth metal structure 412. In addition, one or more fifth metal structures 418 are disposed above the one or more intermediate layers and the fourth metal structure 412. The fifth metal structures 418 are separated from the second metal structure 404 by the dielectric material. One or more fourth vias 420 also pass through the intermediate layers and connect the fourth metal structure 412 to the fifth metal structures 418. The fourth vias 420 are located outside of the radius R from a center of the third via 416. As shown, each fourth via 420 is connected to a separate fifth metal structure 418.

The test pattern is disposed on more than one layer of a silicon-on-insulator structure wherein the intermediate layers substantially comprise a dielectric material. The dielectric material is typically a low-k dielectric material, which may be chosen from the group consisting of polymide, silicon oxycarbide, hydrogen silsesquioxane, methyl silsesquioxane, bezocyclobutene, fluorinated glass, fluorinated aromatic ether, inter-penetrated SOG, SILK™, Nanoglass™, Coral™ and Black Diamond™. Each metal structure 402, 404, 408, 412 and 418 is typically a metal structure formed using a damascene or dual damascene process. The first metal structure 402, second metal structure 404, third metal structure 408, fourth metal structure 412, fifth metal structure 418, first via 406, second vias 410, and third vias 420 are typically copper. The first metal structure 102 and fourth metal structure 412 typically have an area selected from a range of 100 to 500 $\mu m^2$, e.g., planar dimensions of 20 $\mu m$ by a multiple of 3 $\mu m$. In addition, the separation between the second metal structure 404 and the third and fifth metal structures 408 and 418 is typically a multiple of 0.5 $\mu m$.

Figure 5:
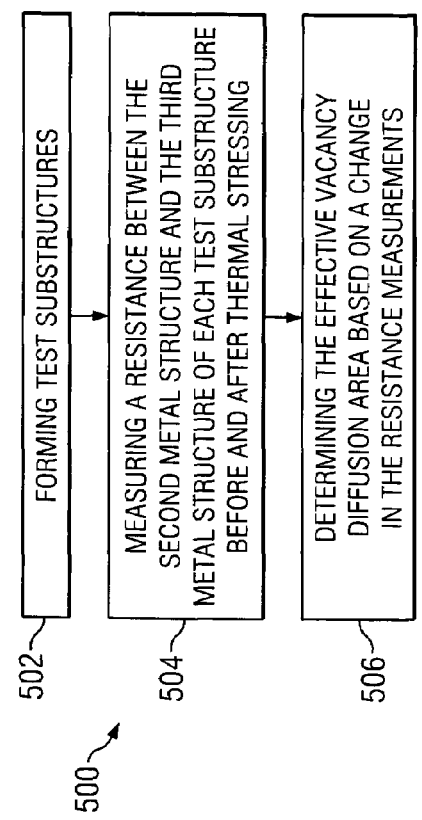
FIG. 5 is a flow chart illustrating the method for determining an effective vacancy diffusion area in accordance with the present invention.

Referring now to FIG. 5, a flow chart illustrating the method 500 for determining an effective vacancy diffusion area in accordance with the preferred embodiment of the present invention is shown. The method 500 is performed by forming two or more test substructures on the substrate in block 502, measuring a resistance between a second metal structure and a third metal structure(s) of each test substructure before and after thermal stressing of the silicon-on-insulator structure in block 504, and determining the effective vacancy diffusion area based on a change in the resistance measurements in block 506. Note that the radius R between the center via and the surrounding vias is different for each substructure and that the effective vacancy diffusion area is determined from the substructure having a radius R that results in an acceptably high resistance level after thermal stress testing. Note that the resistance can also be measured during the thermal stressing. The thermal stressing is typically performed between 125° C. and 300°C over a duration of between 100 and 1000 hours, e.g., approximately 175° C. for 500 hours. In the preferred embodiments, the threshold for determining that the resistance is unacceptably high is a specified contact resistance variation, such as 10%, 20% or 100% depending on the testing parameters.

As previously described with reference to FIGS. 1, 2, 3A, 3B and 4, each test substructure includes a first metal structure disposed on a substrate, one or more intermediate layers disposed above the first metal structure and the second metal structure disposed above the one or more intermediate layers. At least a portion of the second metal structure is disposed above the first metal structure. In addition, the second metal structure is smaller than the first metal structure. The test substructure also includes a first via passing through the intermediate layers and connecting the first metal structure to the second metal structure. The third metal structure(s) are disposed above the one or more intermediate layers and the first metal structure. One or more second vias pass through the intermediate layers and connect the first metal structure to the third metal structures. The third metal structures are located outside of a radius from a center of the first via, which is different for each test substructure, and are separated from the second metal structure by a dielectric material.

Each test substructure may also include a fourth metal structure disposed on the substrate in close proximity to the first metal structure, wherein the one or more intermediate layers are disposed above the fourth metal structure and another portion of the second metal structure is disposed above the fourth metal structure, a third via passing through the intermediate layers and connecting the fourth metal structure to the second metal structure, one or more fifth metal structures disposed above the one or more intermediate layers and the fourth metal structure, and outside of the radius from a center of the third via, the fifth metal structures separated from the second metal structure by the dielectric material, and one or more fourth vias passing through the intermediate layers and connecting the fourth metal structure to the fifth metal structures.

The step of forming two or more test substructures on the substrate may include the step of forming two or more test structures on the substrate, each test structure containing the two or more test substructures wherein the size of the first metal structure is substantially constant for each test substructure and different for each test structure. For example, the test pattern may include three test structures having ten test substructures in the first test structure, seven test substructures in the second test structure and four test substructures in the third test structure.

Figure 6:
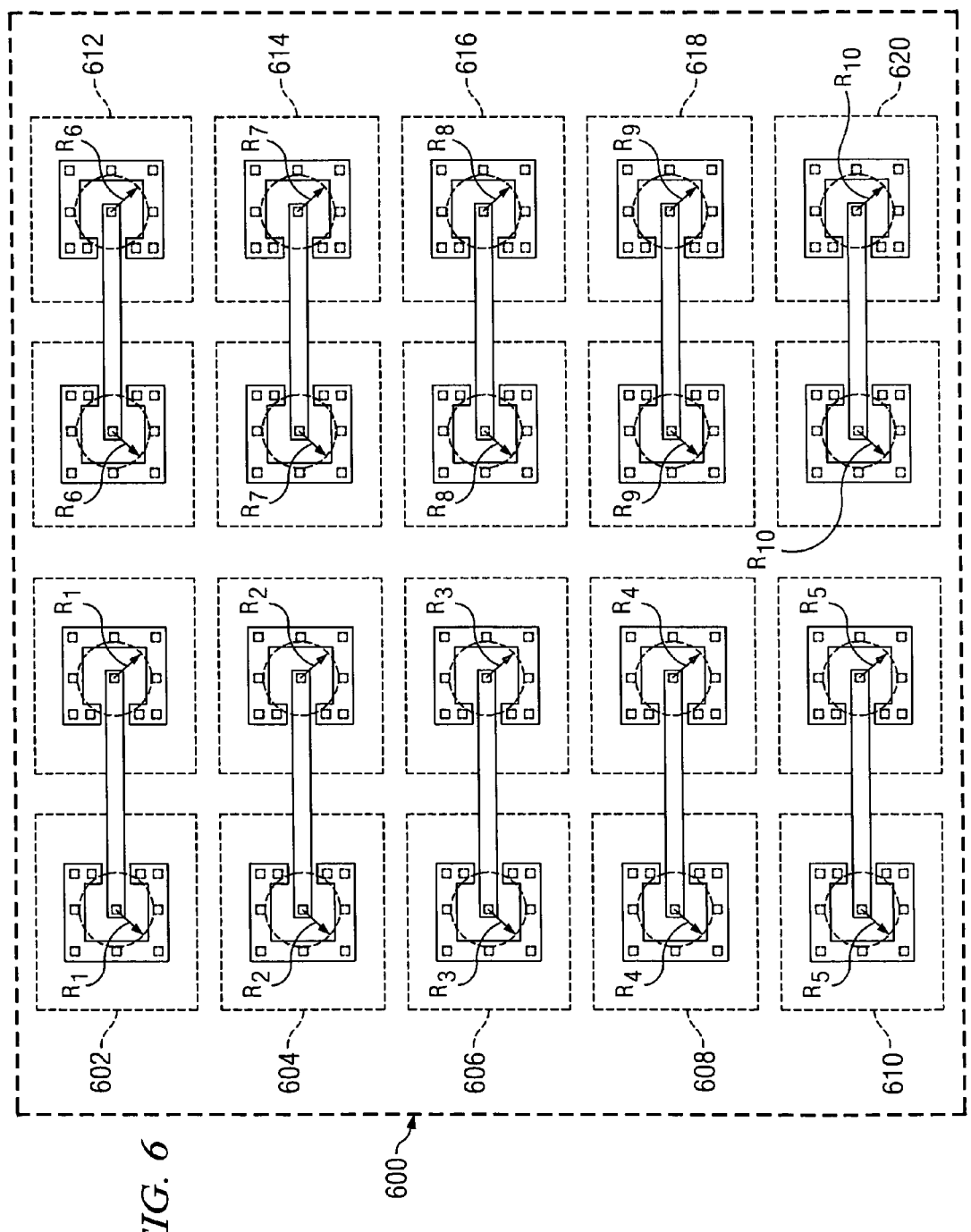
FIG. 6 is a diagram of a test pattern in accordance with one embodiment of the present invention.

Now referring to FIG. 6, a diagram of a test pattern 600 in accordance with one embodiment of the present invention is shown. The test pattern 600 includes two or more test substructures, such as test substructures 602, 604, 606, 608, 610, 612, 614, 616, 618 and 620. As shown, the test substructures 602–620 are constructed in accordance with test substructure 300 (FIGS. 3A and 3B). Note that the test substructures 602–620 can be any combination or variation of the examples shown in FIGS. 1, 2, 3A, 3B, and 4. Each test substructure has a different radius R: Test substructure 602 has radius $R_1$, test substructure 604 has radius $R_2$, test substructure 606 has radius $R_3$, test substructure 608 has radius $R_4$, test substructure 610 has radius $R_5$, test substructure 612 has radius $R_6$, test substructure 614 has radius $R_7$, test substructure 616 has radius $R_8$, test substructure 618 has radius $R_9$, and test substructure 620 has radius $R_{10}$. The test substructures 602–620 can be adjacent to one another or arranged in a block pattern or some other pattern to fit the designated space and testing requirements. The radii $R_1$ to $R_{10}$ are selected to provide a good determination of the effective vacancy diffusion area.

Figure 7B:
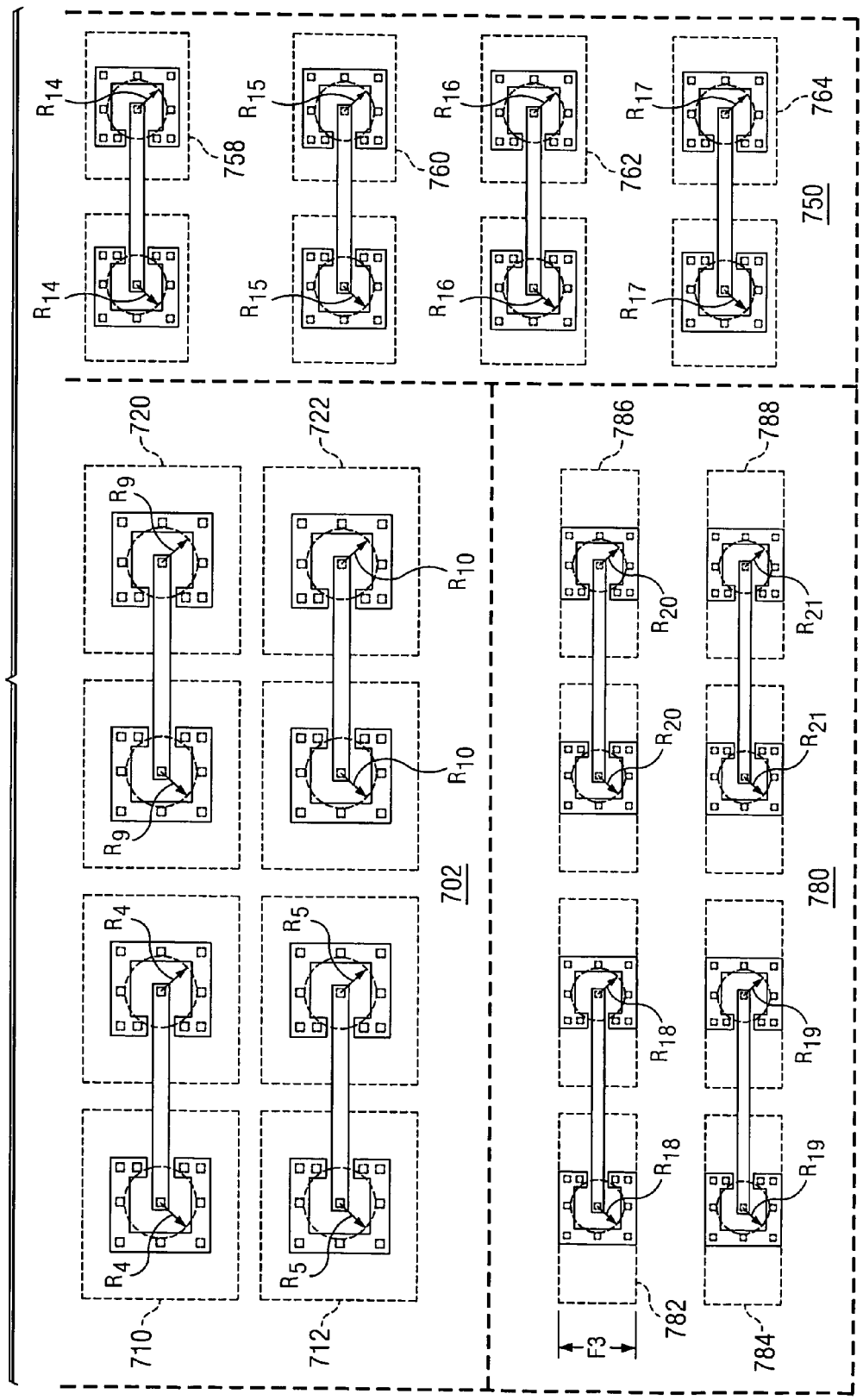
FIG. 7 is a diagram of a test pattern in accordance with another embodiment of the present invention.

Referring now to FIG. 7, a diagram of a test pattern 700 in accordance with another embodiment of the present invention is shown. The test pattern 700 includes three test structures 702, 750 and 780. Each test structure 702, 750 and 780 contains two or more test substructures 704–722, 752–764 and 782–788 wherein the size of the first metal structure is substantially constant for each test substructure and different for each test structure (F1 for each test substructure 704–722 in test structure 702, F2 for each test substructure 752–764 in test structure 750, and F3 for each test substructure 782–788 in test substructure 780. As shown, the test substructures 704–722, 752–764 and 782–788 are constructed in accordance with test substructure 300 (FIGS. 3A and 3B). Note that the test substructures 704–722, 752–764 and 782–788 can be any combination or variation of the examples shown in FIGS. 1, 2, 3A, 3B, and 4. Within each test structure 702, 750 and 780, each test substructure 704–722, 752–764 and 782–788 has a different radius R, for example.

Test structure 702 contains test substructure 704 having radius $R_1$, test substructure 706 having radius $R_2$, test substructure 708 having radius $R_3$, test substructure 710 having radius $R_4$, test substructure 712 having radius $R_5$, test substructure 714 having radius $R_6$, test substructure 716 having radius $R_7$, test substructure 718 having radius $R_8$, test substructure 720 having radius $R_9$, and test substructure 722 having radius $R_{10}$.

Test structure 750 contains test substructure 752 having radius $R_{11}$, test substructure 754 having radius $R_{12}$, test substructure 756 having radius $R_{13}$, test substructure 758 having radius $R_{14}$, test substructure 760 having radius $R_{15}$, test substructure 762 having radius $R_{16}$, and test substructure 764 having radius $R_{17}$.

Test structure 780 contains test substructure 782 having radius $R_{18}$, test substructure 784 having radius $R_{19}$, test substructure 786 having radius $R_{20}$, and test substructure 788 having radius $R_{21}$.

The test substructures 704–722, 752–764 and 782–788 can be adjacent to one another or arranged in a block pattern or some other pattern to fit the designated space and testing requirements. The radii $R_1$ to $R_{21}$ are selected to provide a good determination of the effective vacancy diffusion area.

The desired radius R can be achieved by specifying the separation between the second metal structure and the one or more third metal structures within the test substructures. For example, the second metal structure and the one or more third metal structures within the first, second, third, fourth, fifth, sixth, seventh, eighth, ninth and tenth test substructures of the first test structure are separated by approximately 0.5, 1, 1.5, 2, 2.5, 3, 3.5, 4, 4.5 and 5 µm, respectively. The second metal structure and the one or more third metal structures within the first, second, third, fourth, fifth, sixth and seventh test substructures of the second test structure are separated by approximately 0.5, 1, 1.5, 2, 2.5, 3 and 3.5 µm, respectively. The second metal structure and the one or more third metal structures within the first, second, third and fourth test substructures of the third test structure are separated by approximately 0.5, 1, 1.5 and 2 µm, respectively. The first width for the first test substructure, second test substructure, third test substructure, fourth test substructure and fifth test substructure is approximately 3, 5, 10, 15 and 20 µm, respectively. The first metal structure of each test substructure of the first test structure is approximately 240 µm². The first metal structure of each test substructure of the second test structure is approximately 180 µm². The first metal structure of each test substructure of the third test structure is approximately 120 µm².

The following table lists the dimensions for the test substructures in accordance with one implementation of the present invention. The test pattern illustrated includes twelve test structures with each test structure having five test substructures.

| Structure No. | Sub-structure No. | A | B | C | D | E | F | G | H | No. of Vias |
|---|---|---|---|---|---|---|---|---|---|---|
| Test Pattern | | | | | | | | | | |
| 1 | 1 | 0.3 | 0.1 | 0.11 | 10 | 0.005 | 12 | 20 | 0.5 | 18 |
|   | 2 | 0.3 | 0.1 | 0.11 | 10 | 0.005 | 12 | 20 | 1.0 | 18 |
|   | 3 | 0.3 | 0.1 | 0.11 | 10 | 0.005 | 12 | 20 | 1.5 | 18 |
|   | 4 | 0.3 | 0.1 | 0.11 | 10 | 0.005 | 12 | 20 | 2.0 | 18 |
|   | 5 | 0.3 | 0.1 | 0.11 | 10 | 0.005 | 12 | 20 | 2.5 | 18 |
|   | 6 | 0.3 | 0.1 | 0.11 | 10 | 0.005 | 12 | 20 | 3.0 | 18 |
|   | 7 | 0.3 | 0.1 | 0.11 | 10 | 0.005 | 12 | 20 | 3.5 | 18 |
|   | 8 | 0.3 | 0.1 | 0.11 | 10 | 0.005 | 12 | 20 | 4.0 | 18 |
|   | 9 | 0.3 | 0.1 | 0.11 | 10 | 0.005 | 12 | 20 | 4.5 | 18 |
|   | 10 | 0.3 | 0.1 | 0.11 | 10 | 0.005 | 12 | 20 | 5.0 | 18 |
| 2 | 1 | 0.3 | 0.1 | 0.11 | 10 | 0.005 | 9 | 20 | 0.5 | 18 |
|   | 2 | 0.3 | 0.1 | 0.11 | 10 | 0.005 | 9 | 20 | 1.0 | 18 |
|   | 3 | 0.3 | 0.1 | 0.11 | 10 | 0.005 | 9 | 20 | 1.5 | 18 |
|   | 4 | 0.3 | 0.1 | 0.11 | 10 | 0.005 | 9 | 20 | 2.0 | 18 |
|   | 5 | 0.3 | 0.1 | 0.11 | 10 | 0.005 | 9 | 20 | 2.5 | 18 |
|   | 6 | 0.3 | 0.1 | 0.11 | 10 | 0.005 | 9 | 20 | 3.0 | 18 |
|   | 7 | 0.3 | 0.1 | 0.11 | 10 | 0.005 | 9 | 20 | 3.5 | 18 |
| 3 | 1 | 0.3 | 0.1 | 0.11 | 10 | 0.005 | 6 | 20 | 0.5 | 18 |
|   | 2 | 0.3 | 0.1 | 0.11 | 10 | 0.005 | 6 | 20 | 1.0 | 18 |
|   | 3 | 0.3 | 0.1 | 0.11 | 10 | 0.005 | 6 | 20 | 1.5 | 18 |
|   | 4 | 0.3 | 0.1 | 0.11 | 10 | 0.005 | 6 | 20 | 2.0 | 18 |

Accordingly, the first width for the first test substructure, second test substructure, third test substructure, fourth test substructure and fifth test substructure is approximately 3, 5, 10, 15 and 20 µm, respectively. The second width for each test structure ranges from about 0.1 to 0.8 µm.

While several embodiments of the invention, together with modifications thereof, have been described in detail herein and illustrated in the accompanying drawings, it will be evident that various modifications are possible without departing from the scope of the present invention. The examples given are intended to be illustrative rather than exclusive. The drawings may not necessarily be to scale and features may be shown in a schematic form.

What is claimed is:

1. A method for determining an effective vacancy diffusion area for a silicon-on-insulator structure comprising the steps of:
   forming two or more test substructures on the substrate, each test substructure comprising:
      a first metal structure disposed on a substrate, one or more intermediate layers disposed above the first metal structure;
      a second metal structure disposed above the one or more intermediate layers, wherein at least a portion of the second metal structure is above the first metal structure and the second metal structure is smaller than the first metal structure;
      a first via passing through the intermediate layers and connecting the first metal structure to the second metal structure;
      one or more third metal structures disposed above the one or more intermediate layers and the first metal structure, and separated from the second metal structure by a dielectric material; and
      one or more second vias passing through the intermediate layers and connecting the first metal structure to the third metal structures, each second via located outside of a radius from a center of the first via, which radius is different for each test substructure;
   measuring a resistance between the second metal structure and the third metal structure(s) of each test substructure before and after thermal stressing of the silicon-on-insulator structure; and
   determining the effective vacancy diffusion area based on a change in the resistance measurements.

2. The method as recited in claim 1, wherein the resistance is also measured during the thermal stressing.

3. The method as recited in claim 1, wherein the thermal stressing is performed at a temperature between about 125° C. and about 300° C.

4. The method as recited in claim 1, wherein the thermal stressing is performed over a duration of between about 100 and about 1000 hours.

5. The method as recited in claim 1, wherein each test substructure further comprises:
   a fourth metal structure disposed on the substrate in close proximity to the first metal structure;
   wherein the one or more intermediate layers are disposed above the fourth metal structure and another portion of the second metal structure is disposed above the fourth metal structure;
   a third via passing through the intermediate layers and connecting the fourth metal structure to the second metal structure;
   one or more fifth metal structures disposed above the one or more intermediate layers and the fourth metal structure, and separated from the second metal structure by the dielectric material; and
   three or more fourth vias passing through the intermediate layers and connecting the fourth metal structure to the fifth metal structures, each fourth via located outside of the radius from a center of the third via.

6. The method as recited in claim 1, wherein the first via is approximately centered over the first metal structure.

7. A method for determining an effective vacancy diffusion area for a silicon-on-insulator structure comprising the steps of:
forming two or more test structures, each test structure formed by the steps of:
forming two or more test substructures on the substrate, each test substructure comprising:
a first metal structure disposed on a substrate, one or more intermediate layers disposed above the first metal structure;
a second metal structure disposed above the one or more intermediate layers, wherein at least a portion of the second metal structure is above the first metal structure and the second metal structure is smaller than the first metal structure;
a first via passing through the intermediate layers and connecting the first metal structure to the second metal structure;
one or more third metal structures disposed above the one or more intermediate layers and the first metal structure, and separated from the second metal structure by a dielectric material; and
one or more second vias passing through the intermediate layers and connecting the first metal structure to the third metal structures, each second via located outside of a radius from a center of the first via, which radius is different for each test substructure;
wherein the radius for each said test structure is different from the radius of each other of said test structures;
measuring a resistance between the second metal structure and the third metal structure(s) of each test substructure before and after thermal stressing of the silicon-on-insulator structure; and
determining the effective vacancy diffusion area based on a change in the resistance measurements.

8. The method as recited in claim 7, wherein the resistance is also measured during the thermal stressing.

9. The method as recited in claim 8, wherein the first metal of each test substructure within a test structure has an area that is different from the area of the first metal of each test substructure within each other test structure.

10. The method as recited in claim 7, wherein the one or more third metal structures are coupled together for each test substructure within each test structure.

11. The method as recited in claim 7, wherein the one of more third metal structures are electrically isolated one from another within each test substructure within each test structure.

12. A method for determining an effective vacancy diffusion area for a silicon-on-insulator structure comprising the steps of:
forming a plurality of test structures, the method for forming each test structure comprising the steps of:
forming two or more test substructures on the substrate, each test substructure comprising:
a first metal structure disposed on a substrate, one or more intermediate layers disposed above the first metal structure;
a second metal structure disposed above the one or more intermediate layers, wherein at least a portion of the second metal structure is above the first metal structure and the second metal structure is smaller than the first metal structure;
a first via passing through the intermediate layers and connecting the first metal structure to the second metal structure;
one or more third metal structures disposed above the one or more intermediate layers and the first metal structure, and separated from the second metal structure by a dielectric material; and
one or more second vias passing through the intermediate layers and connecting the first metal structure to the third metal structures, each second via located outside of a radius from a center of the first via, which radius is different for each test substructure;
a fourth metal structure disposed on the substrate in close proximity to the first metal structure;
wherein the one or more intermediate layers are disposed above the fourth metal structure and another portion of the second metal structure is disposed above the fourth metal structure;
a third via passing through the intermediate layers and connecting the fourth metal structure to the second metal structure;
one or more fifth metal structures disposed above the one or more intermediate layers and the fourth metal structure, and separated from the second metal structure by the dielectric material;
three or more fourth vias passing through the intermediate layers and connecting the fourth metal structure to the fifth metal structures, each fourth via located outside of the radius from a center of the third via;
wherein the radius for each said test structure is different from the radius of each other of said test structures;
measuring a resistance between the second metal structure and the third metal structure(s) of each test substructure before and after thermal stressing of the silicon-on-insulator structure; and
determining the effective vacancy diffusion area based on a change in the resistance measurements.

13. The method of claim 12, wherein the area of the first metal for each of the test substructures is different from the area of the first metal for each other of the test substructures.

14. The method of claim 12, wherein the step of determining the effective vacancy diffusion area based on a change in resistance measurements further comprises measuring the resistance during the thermal stress.

15. The method of claim 12 wherein the dielectric material is a low-k dielectric material.

16. The method of claim 15, wherein the low-k dielectric material is one selected from the group of polymide, silicon oxycarbide, hydrogen silsesquioxane, methyl silsesquioxane, bezocyclobutene, fluorinated glass, fluorinated aromatic ether, inter-penetrated SOG, SILK™, Nanoglass™, Carol™ and Black Diamond™.

17. The method of claim 12, wherein the step of forming two or more test substructures within two or more test structures further comprises forming different numbers of test substructures within said test structures, each test structure having substructures with different first metal areas than the other test structures, each test substructure having a different radius than the other substructures within one of said test structures.

18. The method of claim 12, wherein the first via is centered over the first metal structure.

19. The method of claim 12, wherein the first, second and third metal structures comprise:
a metal taken from the group of copper and its alloys.

20. The method of claim 12, wherein the step of thermal stressing be performed at, or between about 125 degrees C. and about 300 degrees C.

* * * * *

UNITED STATES PATENT AND TRADEMARK OFFICE
CERTIFICATE OF CORRECTION

PATENT NO. : 7,074,629 B2 Page 1 of 1
APPLICATION NO. : 11/018604
DATED : July 11, 2006
INVENTOR(S) : Yao et al.

It is certified that error appears in the above-identified patent and that said Letters Patent is hereby corrected as shown below:

Column 3, line 13; delete "ate"; insert --are--

Signed and Sealed this

Thirtieth Day of January, 2007

JON W. DUDAS
*Director of the United States Patent and Trademark Office*